United States Patent [19]

Bender et al.

[11] Patent Number: 4,529,999
[45] Date of Patent: Jul. 16, 1985

[54] GATE CONTROLLED SWITCH

[75] Inventors: John R. Bender, Mesa; James R. Washburn, Scottsdale, both of Ariz.

[73] Assignee: Motorola, Inc., Schaumburg, Ill.

[21] Appl. No.: 396,554

[22] Filed: Jul. 9, 1982

[51] Int. Cl.³ ............... H01L 29/74; H01L 29/06; H01L 23/48

[52] U.S. Cl. ............... 357/38; 357/20; 357/68

[58] Field of Search ............... 357/20, 38, 68, 38 P

[56] References Cited

U.S. PATENT DOCUMENTS 3,609,476 9/1971 Storm ............... 357/38
4,092,703 5/1978 Sueoka et al. ............... 357/20

OTHER PUBLICATIONS

"An Involute Gate-Emitter Configuration for Thyristors", Storm et al., IEEE Trans. on Elect. Dev., vol. ED-21, No. 8, 1974, pp. 520-522.

Primary Examiner—Martin Edlow
Assistant Examiner—Terri M. Henn
Attorney, Agent, or Firm—Robert M. Handy

[57] ABSTRACT

An improved semiconductor device, particularly a gate controlled switch is provided by optimally fitting an involute spiral cathode-gate structure into a substantially square device. 4N cathode-gate branches radiate from a central gate portion and intersect the perimeter of the square device region at predetermined locations, N per side, where N is an integer. Four of the branches tangentially intercept the square perimeter at a distance R from a centerline where R is the radius of the central gate portion. The origin of the branches is angularly displaced from the line connecting the die center to the tangential intercept point by (L/R)−arctan (L/R) radians where L is half the edge length of the square device region. Improved thermal performance is obtained by thermally coupling the cathode heat spreader to the gate as well as cathode portions of the device.

16 Claims, 4 Drawing Figures

—PRIOR ART—

—PRIOR ART—

GATE CONTROLLED SWITCH

BACKGROUND OF THE INVENTION

1. Field of the Invention

This invention relates in general to improved semiconductor devices or components and, more particularly, to improved transistors, thyristors and gate controlled switches.

2. Background Art

In power devices which handle heavy currents, the switching performance is very dependent upon differences in the lateral resistance. In transistors this would correspond to the lateral base and emitter resistance and in thyristors and gate controlled switches to the lateral gate and cathode resistance. For the purposes of this invention, the words "emitter" and "cathode" are used equivalently to stand for a principal injecting region of the device, and the words "base", "gate", and "control region" are used equivalently to stand for a principal controlling region of the device.

Power devices are sensitive to local variations in lateral resistance because such variations produce local variation in the lateral voltage drop. The varying localized voltage drop provides a different bias to different device regions which in turn causes conduction nonuniformity. During switching this conduction nonuniformity can lead to current crowding. There is a tendency for localized points of high conduction to enter regenerative thermal runaway or, at least, to require much higher switching drive. The problem is particularly severe in fast switching thyristors and gate controlled switches, i.e. gate turn-off thyristors, since charge injection or extraction during turn-on and turn-off is very sensitive to differences in the lateral distance, and hence resistance, between the gate electrode and cathode.

The involute spiral cathode-gate geometry has been applied to circular thyristors and gate controlled swithes to improve their switching performance. See for example, "An Involute Gate-Emitter Configuration for Thyristors," H. F. Storm et al., IEEE Transaction on Electron Devices, Vol. ED-21, No. 8, August 1974, pages 520–522, and "Semiconductor Power Devices," S. K. Ghandi, John Wiley and Sons, New York, 1977, pages 217–219 and 231–236.

An involute spiral resembles a spoked wheel in which the rim has been rotated through a predetermined angle while the hub is held fixed. However, unlike an ordinary radial spoke configuration, the involute spiral has the property that adjacent spokes are everywhere equidistant, independent of radius. Thus when the cathode and gate are arranged as involute spirals, the lateral cathode-gate spacing is everywhere constant. This arrangement gives improved device performance.

However, despite these improvements, prior art involute type devices have been expensive to manufacture because this configuration has been applied only to circular die. Circular die require additional shaping steps and waste substantial amounts of starting material since they must be cut from larger wafers. Both factors increase manufacturing costs. While prior art involute designs have been well adapted for circular die, they have not been suitable for use on rectangular or square die which are easier to shape and less wasteful of wafer area. Square die thyristors or gate controlled switches have continued to use conventional square "washer" shaped cathodes or "interdigitated finger" cathode-gate arrangements which do not provide the improved switching performance possible with an involute spiral cathode-gate structure. Furthermore, prior art devices continue to be limited in performance because only portions of the cathode-gate electrodes are thermally coupled to the conductive heat spreader used to extract heat from the front face of the semiconductor die or device. An air gap separates the remaining portions from the heat spreader of the typical pressure mounted package.

Accordingly, it is an object of the present invention to provide a semiconductor component in square form having improved switching performance while still making optimal use of the available device area.

It is an additional object of the present invention to provide an improved semiconductor component having an involute type device structure adapted for use on square rather than round die.

It is a further object of the present invention to provide an improved involute type device structure which has superior thermal dissipation characteristics.

It is an additional object of the present invention to provide an involute device geometry which makes maximum use of the available area of a square die by providing a predetermined number of involute arms or branches which intersect the substantially rectangular perimeter of the device in predetermined locations.

It is a further object of the present invention to improve heat extraction from the top surface of the device which has thereon the involute device structure.

SUMMARY OF THE INVENTION

In accordance with the present invention there is provided a semiconductor component having an involute cathode-gate configuration comprising a substantially square device region of predetermined perimeter wherein the cathode-gate structure is characterized by 4N branches, where N is a positive integer, and by four of the branches having a side which substantially tangentially intersects the perimeter. There is further provided within the semiconductor component superposed regions of different conductivity type. The cathode branches have principal width C and the gate branches have principal width G and the ratio G/C is in the range 0.3 to 1.0 with 0.4 to 0.6 being desirable. It is further provided that the tangential intersections with the perimeter are spaced a predetermined distance from centerlines passing through the center of the square device region and located at right angles to the edges of the square device region, and that the predetermined distance corresponds to the radius of a circle substantially defining the innermost extent of the branches, and on which lies the origin of each branch, that origin being angularly displaced from a line connnecting the tangential intercept point to the center by a predetermined rotational amount related to the device dimensions.

There is further provided a gate metallization contacting the gate, a cathode metallization contacting the cathode, and a heat spreader overlying the cathode-gate branches, adapted to remove heat from the device region, and electrically and thermally coupled to the cathode branches and thermally but not electrically coupled to the gate branches by means of thermally conductive electrically insulating solid material covering the gate metallization on the gate branches and underlying the heat spreader.

DETAILED DESCRIPTION OF THE DRAWINGS

Figure 1:
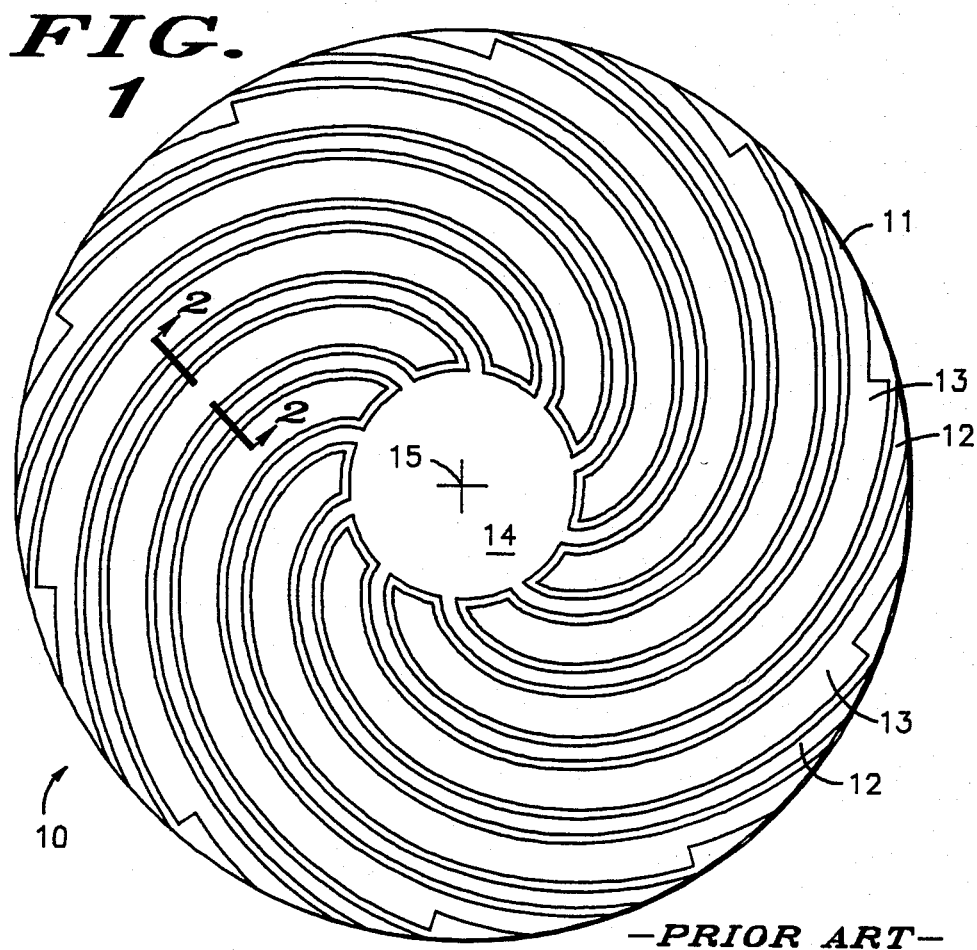
FIG. 1 shows a top view of a typical circular prior art involute device structure.

FIG. 1 shows a top view of a typical prior art involute type device structure 10 comprising circular die 11 having thereon centrally located gate contact region 14 from which radiate involute spiral branches or arms 12 and 13, branches 12 corresponding to the gate and gate metal, and branches 13 corresponding to the cathode and cathode metal. It will be seen that cathode branches 13 and gate branches 12 have uniform width and separation independent of the radius from center 15 of circular die 11. It can be shown that prior art device structure 10 is not suitable for use on a square die in a way that makes optimal use of the available area of the die. This is in part due to the fact that the number of branches of prior art device 10 is not divisible by four and hence device 10 cannot be arranged on a square die in a fashion which will efficiently fill the corners of the square.

Figure 2:
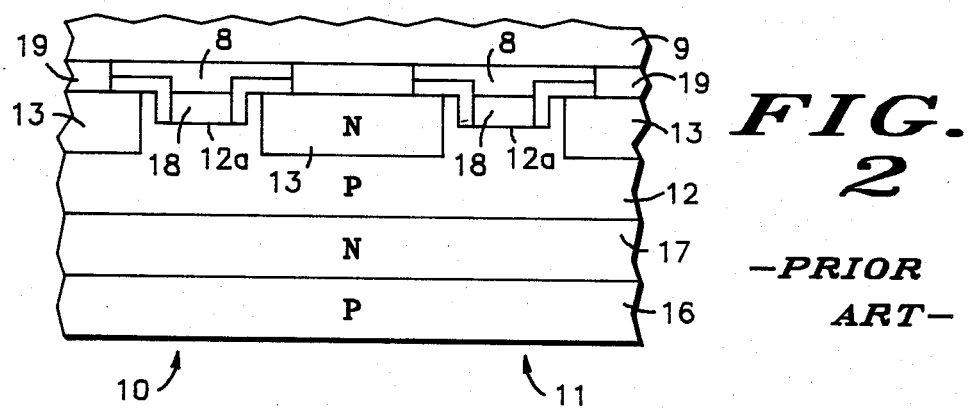
FIG. 2 shows a simplified cross section of a portion of the device of FIG. 1.

FIG. 2 shows a simplified cross section of a portion of the device of FIG. 1. Device 10, which is illustrated as a thyristor or gate controlled switch, has anode region 16, blocking region 17, control or gate region 12, and cathode region 13. Gate contact region 12a has been etched into the die 11 so that the surface of gate metal 18 lies below the level of cathode metal 19. This allows annular cathode contact and heat spreader 9 to be pressure mounted on cathode metal 19 without shorting to gate metal 18. A weakness of this prior art configuration is that air gap 8 between gate metal 18 and heat spreader 9, which provides the electrical isolation between the two, also introduces a substantial thermal impedance. Hence the effective heat extraction area is reduced by the cross-sectional area of the gate branches. Since the gates occupy a significant fraction of the total device area, particularly in a gate turn-off device, the efficacy of the cathode heat spreader in extracting heat from the front face of the device is substantially reduced.

Figure 3:
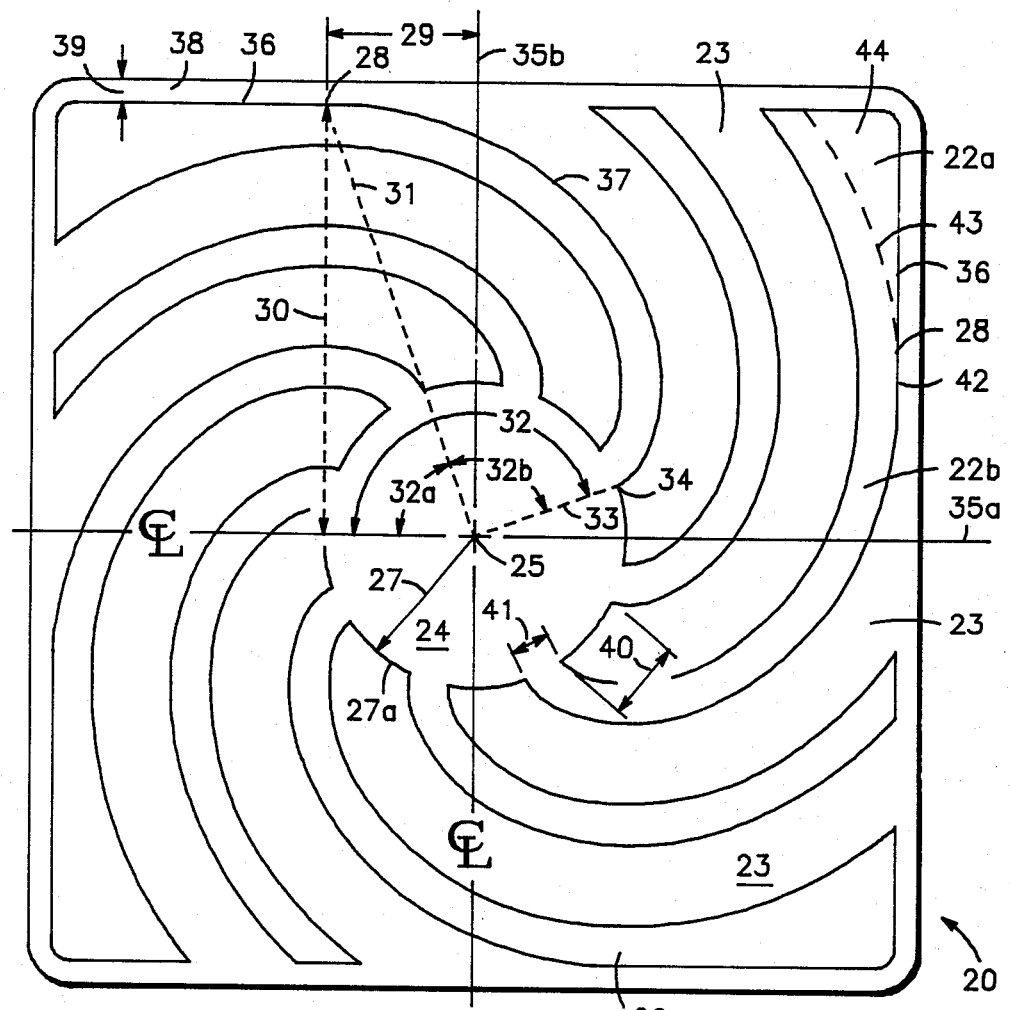
FIG. 3 shows a top view of a substantially square involute device structure according to the present invention.

FIG. 3 shows a top view of cathode and gate regions of a square involute type device according to the present invention, comprising square die 20 having therein gate region 22 and cathode regions 23 arranged in the form of involute spiral branches radiating from central gate contact region 24. The gate metal and cathode metal have been omitted from FIG. 3 for clarity. The number of cathode or gate branches must be 4N where N is a positive integer. In this way the same number of branches intersect each side of the square and four branches are available to match the corners. The device of FIG. 3 has N=2. Rectangular device region 20 has orthogonal center lines 35a-b arranged at right angles to the edges of the square and whose intersection corresponds substantially to the center of the die and center 25 of central gate region 24. It can be shown that when 4N branches are used, that one side of each of four branches can be arranged to intersect perimeter 36 tangentially at intercept point 28. A cathode tangent intercept is also a gate tangent intercept, since the intercept by the "side" of either region corresponds to an intercept by the line of the p-n junction dividing the cathode and gate regions.

Intercept point 28 is located distance 29 from centerline 35b. Distance 29 also corresponds to radius 27 of circle 27a which is the "generating circle" for the involute curves. The term "generating circle" as used herein refers to a concept well known in the art. The involute curve is the path followed by the end of an imaginary string being unwound from a circle of specified radius. This circle is called the generating circle and the corresponding radius is called the generating radius. It is convenient to use generating circle 27a as the innermost terminus of involute spiral branches 22 and 23. Generating circle 27a also conveniently forms central portion 24 of the gate. The origins, i.e. beginning points, of the involute curves which form the sides of gate regions 22 and cathode regions 23 lie on generating circle 27a of radius 27.

Involute curve 37 has origin point 34 and tangential intercept 28. Tangential intercept point 28 is separated from centerline 35a by distance 30. Line 33 connecting origin point 34 to center 25 is rotated with respect to centerline 35a by angle 32. It can be shown that angle 32, measured in radians, is related to the device dimensions and is given by the ratio L/R, where L corresponds to length 30 and R corresponds to radius 27. L also is approximately half the edge length of the substantially rectangular device active area. Line 31 connects tangential intercept 28 to origin 25. Radius 27 lying on centerline 35a, line 30 and line 31 form a right triangle, so that angle 32a is given by arctan L/R. Angle 32b formed between line 33 connecting origin 34 to center 25 and line 31 connecting intercept 28 to center 25 is then given by (L/R)−arctan (L/R), expressed in radians.

It is convenient but not essential to have perimeter 36 of device region 20 include border region 38 of width 39 which is common with cathodes 23. Border 38 serves to tie the outward ends of cathode branches 23 together. Cathode branches 23 have width 40 and gate branches 22 have width 41. Except at the extremeties where cathode branches 23 intersect perimeter 36, cathode width 40 is substantially constant. Similarly, except in corner portions 22a, gate width 41 ia also substantially constant. Generally, it is desired that width 39 of border region 38 be less than one half of cathode width 40, preferable less than one-third of cathode width 40, since border region 38 has an active gate regin, i.e. gate directly connected to gate metal, only on the interior side of border region 38. This is permits cathode current flow in border region 38 to be readily pinched-off.

A feature of the present invention is that the intersection of the involute branches on the device perimeter are chosen so that four branches have a side making a substantially tangential intercept with perimeter 36, and that four adjacent gate branches are extended into corner portions 22a of rectangular device 20. Between tangential intercept 28 and corner 22a, edge 42 of gate 22b is extended along or parallel to perimeter 36 rather than following normal involute contour 43, so that corner portion 44 is occupied by gate rather than cathode, as would be the case for a normal circular involute type device. This is important, since if region 44 were occupied by cathode, it would not be symmetrically located with respect to the gate, that is, there would not be a gate portion on either side of region 44 and the cathode current flowing in region 44 would be difficult to pinch off, leading to hot spots, very non-uniform conduction, and poor switching properties. By filling region 44 with gate this effect is avoided. Thus, one of the features of the present design is that it provides for optimal use of the available area of a square die while avoiding hot spots which would otherwise form in the corners.

Figure 4:
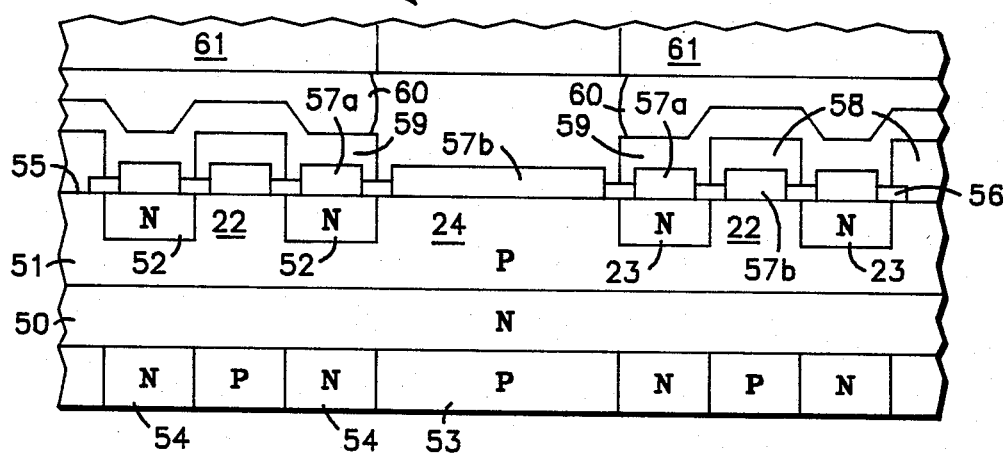
FIG. 4 shows a simplified cross section of the device structure of FIG. 2 and with additional device layers.

FIG. 4 is a cross-sectional view in simplified form of the device of FIG. 3 along centerline 35a, but including gate and cathode metal, dielectric insulating layers, other conductors on the device surface, and the heat spreader used to extract heat from the front face of the device. The cross-section is illustrated for the case of a PNPN thyristor type device having anode shorts. Other device types could equally well be used. Anode 53 is formed from a p-type layer on which is superposed n-type blocking layer 50. Anode shorts are provided by n-type regions 54. It is convenient that region 54 also have an involute spiral shape and be aligned beneath cathode 52. Gate or base region 51 is formed on blocking region 50 and is p-type. Cathode regions 52 corresponding to branches 23 are formed in gate 51 and extend to surface 55. Surface 55 includes protective oxide layer 56 in which openings have been provided for making contact to gate 51 and cathodes 52 at multiple points. Aluminum layer 57a-b is provided to contact cathodes 52 and gate 51 respectively. Solid dielectric layer 58 is provided to cover gate metal 57b lying between cathode branches 23. Layer 58 is desirably made from refractory oxides or nitrides, with silicon oxide being suitable. Alternatively, organic dielectric materials such as polyimides may be used for layer 58, or a combinations of refractory and organic dielectrics. Layer 58 conveniently has a thickness of 1 micrometer, but thicknesses in the range 0.5 to 5 micrometer are useful.

Cathode metal 57a and dielectric region 58 are covered by metal layer 59 conveniently formed from successive layers of chromium, copper, and gold, although other metals are also useful. Metal layer 59 makes electrical and thermal contact to cathode branches 52 (23 of FIG. 3), and thermal but not electrical contact to portions 22 of gate 51 lying between cathode branches 23. This is an important feature of the present invention since it insures that metal layer 59 is thermally coupled to substantially the entire portion of device surface 55 between central gate portion 24 (FIG. 3) and perimeter 36, which is where the principal thermal dissipation occurs within device 20. Annular heat spreader 61 is attached to metal layer 59 by means of, for example, solder connection 60. Solder connection 60 accomodates the differences in elevation of various portions of metal layer 59 and insures that heat spreader 61 is in good thermal contact to all portions of metal layer 59. Heat spreader 61 is in turn coupled to an external heat dissipator or heat sink (not shown) to remove heat from front face 55 of device 20. By providing good thermal coupling to both gate and cathode regions 22 and 23, the thermal performance of device 20 is improved over the prior art.

It has been found that the ratio of gate width 41 to cathode width 40 is important. Where C denotes principal cathode width 40 and G denotes principle gate width 41, the ratio G/C should be in the range 0.3 to 1.0, and desirably in the range 0.4 to 0.6, with 0.5 being particularly convenient. In general, dimension L is determined in part by the maximum allowable die size that will fit in a given package, taking into account the peripheral area needed for the etched moat or scribe line that is used to separate the individual die, and where required by the voltage specifications, any bevel taper at the die edges to reduce the surface electric field of the blocking junctions. Dimension L is also determined in part by the desired current rating, since it is well kown that device operation must be limited to a safe cathode current density, and the total cathode area and hence total current capability depend on the dimensions of the device active area. The radius R of central gate portion 24 of FIG. 3 is determined in general by the size of the external gate contact required to carry the necessary gate current. Once L and R have been selected, then the intersection and origin of the involute spirals can be readily determined, as previously explained. Depending upon the cathode width selected and the factor G/C, the number of involute spirals necessary to make maximum use of the avaiable device area can be readily determined consistent with the requirement that there be 4N cathode (or gate) branches, where N is a positive integer. The square involute device structure of the present invention provides improved switching performance, particularly di/dt, as compared to prior art square devices.

Having thus described the invention, it will be apparent to those of skill in the art that various modifications can be made within the spirit and scope of the present invention. In particular, the present invention can be used with many different device types. For example, where a transistor type device is desired, then layer 53 and anode shorts 54 of FIG. 4 would be omitted. Further, square devices of many different sizes and having many different 4N numbers of involute cathode-gate branches can be used according to this invention. It is intended to encompass all such variations as fall within the spirit and scope of the invention.

We claim:
1. A semiconductor component comprising:
a substantially square device region of predetermined perimeter having first and second opposed surfaces;
a first region of a predetermined first conductivity type coupled to said first surface;
a second region of a second conductivity type on said first region and extending to said second surface, and having therein a central portion of predetermined extent at said second surface;
a third region of said first conductivity type, formed in said second region and extending to said second surface;
wherein said third region consists of 4N branches, N being a positive integer;
wherein each said branch radiates from said central portion and follows substantially the shape of an involute spiral curve; and wherein said branches intersect said perimeter so that four of said branches have a side which substantially forms a tangent intercept with said perimeter.

2. The semiconductor component of claim 1 further comprising a fourth region of said second conductivity type between said first region and said first surface.

3. The semiconductor component of claim 2 further comprising a fifth region of said first conductivity type formed in said fourth region and extending from said first region to said first surface.

4. The semiconductor component of claim 3 wherein said fifth region has an involute spiral shape substantially aligned with said third region.

5. The semiconductor component of claim 1 wherein said branches have a substantially uniform width C, wherein said branches are laterally separated by a substantially uniform width G, and further wherein a ratio G/C is in the range 0.3 to 1.0.

6. The semiconductor component of claim 7 wherein G/C is in the range 0.4 to 0.6.

7. The semiconductor component of claim 1 wherein said substantially square device region has an edge length of 2L and orthogonal centerlines oriented perpendicular to said edges, and wherein said central portion is substantially circular and of radius R from a center formed by the intersection of said orthogonal centerlines, and wherein said tangent intercept is positioned a distance R from one of said centerlines.

8. The semiconductor component of claim 7 wherein said branch whose side forms a tangent intercept with said perimeter has an origin point substantially on a perimeter of said central portion which is angularly displaced from a line connecting said tangent intercept point with said center of said central portion by (L/R)−arctan (L/R) radians.

9. The semiconductor component of claim 1 wherein said third region further comprises a border portion substantially corresponding to said perimeter and extending to said second surface.

10. A gate controlled semiconductor switch comprising:
a device region of substantially square perimeter having therein a first region of a first conductivity type, a second region of a second conductivity type, and a third region of a first conductivity type arranged in stacked relationship, and wherein said third region has a central portion of radius R from a predetermined center, and wherein said substantially square perimeter has orthogonal center lines passing through said center and oriented substantially at right angles to said square perimeter; and
a fourth region of a second conductivity type formed in said third region and having 4N branches, where N is a positive integer, and wherein said branches radiate as involute curves from said central portion and intersect said substantially square perimeter such that one side of each of four of said branches makes a substantially tangential intercept with said perimeter a distance R from a center line.

11. The gate controlled switch of claim 10 wherein each of said one sides has a starting point on a perimeter of said central portion which is angularly displaced from one of said centerlines by L/R radians, where L is a perpendicular distance greater than R from said one centerline to said tangential intercept point.

12. A semiconductor thyristor device having an involute spiral gate-cathode configuration comprising:
a substantially square device region of predetermined perimeter;
a gate-cathode structure characterized by 4N branches, where N is a positive integer, and by four of said branches having one side tangentially intersecting said perimeter.

13. The semiconductor device of claim 12 wherein said four branches are gate branches, and wherein a gate-cathode p-n junction continues from a point where said tangentially intersecting occurs toward a corner of said substantially square device region along a line parallel or coincident with a side of said substantially square device region, substantially to said corner of said device region, so as to provide a gate region in said corner.

14. A semiconductor component comprising:
a substantially square device region of predetermined perimeter having first and second opposed surfaces;
a first region of a predetermined first conductivity type coupled to said first surface;
a second region of a second conductivity type on said first region and extending to said second surface, and having therein a central portion of predetermined extent at said second surface;
a third region of said first conductivity type, formed in said second region and extending to said second surface;
a first conductor electrically contacting said second region;
a dielectric layer covering a first portion of said second conductor on said branches;
a second conductor electrically contacting said third region;
a third conductor substantially covering said square device region outside said central portion and thermally coupled to said first and second regions outside said central portion, wherein said third conductor electrically contacts said second conductor but not said first conductor;
wherein said third region consists of 4N branches, N being a positive integer;
wherein each said branch radiates from said central portion and follows substantially the shape of an involute spiral curve; and
wherein said branches intersect said perimeter so that four of said branches have a side which substantially forms a tangent intercept with said perimeter.

15. A semiconductor component comprising:
a substantially square device region of predetermined perimeter having first and second opposed surfaces;
a first region of a predetermined first conductivity type coupled to said first surface;
a second region of a second conductivity type on said first region and extending to said second surface, and having therein a central portion of predetermined extent at said second surface;
a third region of said first conductivity type, formed in said second region and extending to said second surface;
a first conductor electrically contacting said second region;
a dielectric layer covering a first portion of said second conductor on said branches;
a second conductor electrically contacting said third region;
a third conductor substantially covering said square device region outside said central portion and thermally coupled to said first and second regions outside said central portion, wherein said third conductor electrically contacts said second conductor but not said first conductor;
a metallic heat spreader adapted to remove heat from said component, concentric with said central region, electrically and thermally coupled to said third conductor, and thermally but not electrically coupled to said first portion of said first conductor;
wherein said third region consists of 4N branches, N being a positive integer;

wherein each said branch radiates from said central portion and follows substantially the shape of an involute spiral curve, and wherein said branches intersect said perimeter so that four of said branches have a side which substantially forms a tangent intercept with said perimeter.

16. A gate controlled semiconductor switch comprising:

a device region of substantially square perimeter having therein a first region of a first conductivity type, a second region of a second conductivity type, and a third region of said first conductivity type arranged in stacked relationship, and wherein said third region has a central portion of radius R from a predetermined center, and wherein said substantially square perimeter has orthogonal center lines passing through said center and oriented substantially at right angles to said square perimeter;

a fourth region of said second conductivity type formed in said third region and having 4N branches, where N is a positive integer and wherein said branches radiate as involute curves from said central portion and intersect said substantially square perimeter such that one side of each of four of said branches makes a substantially tangential intercept with said perimeter a distance R from a center line; and a heat spreader adapted to remove heat from said switch, wherein said heat spreader is electrically and thermally coupled to said fourth region and thermally coupled to but electrically isolated from portions of said third region lying between said branches.

* * * * *